US007078988B2

(12) United States Patent
Suzuki et al.

(10) Patent No.: US 7,078,988 B2
(45) Date of Patent: Jul. 18, 2006

(54) COMMON-MODE FILTER

(75) Inventors: Hiroshi Suzuki, Tokyo (JP); Toshihiro Kuroshima, Tokyo (JP); Toshio Tomonari, Tokyo (JP); Katsumi Saito, Tokyo (JP); Katsuyuki Suzuki, Tokyo (JP); Akira Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/815,682

(22) Filed: Apr. 2, 2004

(65) Prior Publication Data

US 2004/0263285 A1    Dec. 30, 2004

(30) Foreign Application Priority Data

Apr. 3, 2003    (JP)    ............. P. 2003-100118

(51) Int. Cl.
*H03H 7/00* (2006.01)
*H01F 5/02* (2006.01)
*H01F 27/28* (2006.01)

(52) U.S. Cl. .................. 333/181; 333/185; 336/83; 336/195

(58) Field of Classification Search ............. 333/12, 333/181, 185; 336/96, 192, 195, 200, 213, 336/211, 83, 198, 208
See application file for complete search history.

(56) References Cited

U.S. PATENT DOCUMENTS 6,154,112 A * 11/2000 Aoba et al. ............. 336/192

| | | | |
|---|---|---|---|
| 6,348,850 B1 * | 2/2002 | Kimura et al. | 336/200 |
| 6,535,095 B1 * | 3/2003 | Aoki et al. | 336/83 |
| 6,778,055 B1 * | 8/2004 | Wang | 336/83 |
| 2003/0030526 A1 * | 2/2003 | Hirai et al. | 336/83 |

FOREIGN PATENT DOCUMENTS

| JP | 02042705 A | * | 2/1990 |
|---|---|---|---|
| JP | 05343233 A | * | 12/1993 |
| JP | A-2000-100625 | | 4/2000 |
| JP | 2000311816 A | * | 11/2000 |
| JP | 2002075722 A | * | 3/2002 |
| JP | 2003077730 A | * | 3/2003 |

* cited by examiner

*Primary Examiner*—Seungsook Ham
(74) *Attorney, Agent, or Firm*—Oblon, Spivak, McClelland, Maier & Neustadt, P.C.

(57) ABSTRACT

A common-mode filter with a drum type core including a core portion and flange portions. Electrodes are provided on the flange portions and a pair of wires are wound on the core portion. The wound pair of wires have ends connected to respective ones of the electrodes. Each of the flange portions has a groove between corresponding two of the electrodes and a separation protrusion for separating the groove into two lead-out groove portions. The pair of wires are wound on the core portion in such a distributed winding manner that an inter-wire distance between the pair of wires and a winding pitch between adjacent turns in each of the pair of wires are provided. The wires are one-by-one led out through the lead-out groove portions while separated by the separation protrusions so that the ends of the pair of wires are connected to respective electrodes.

8 Claims, 6 Drawing Sheets

COMMON-MODE FILTER

BACKGROUND OF THE INVENTION

The present invention relates to a common-mode filter for suppressing common-mode noise in a signal line or the like and particularly to a small-size common-mode filter used in a high-speed differential signal interface such as a DVI (digital visual interface) or an HDMI (high definition multimedia interface).

Figure 8:
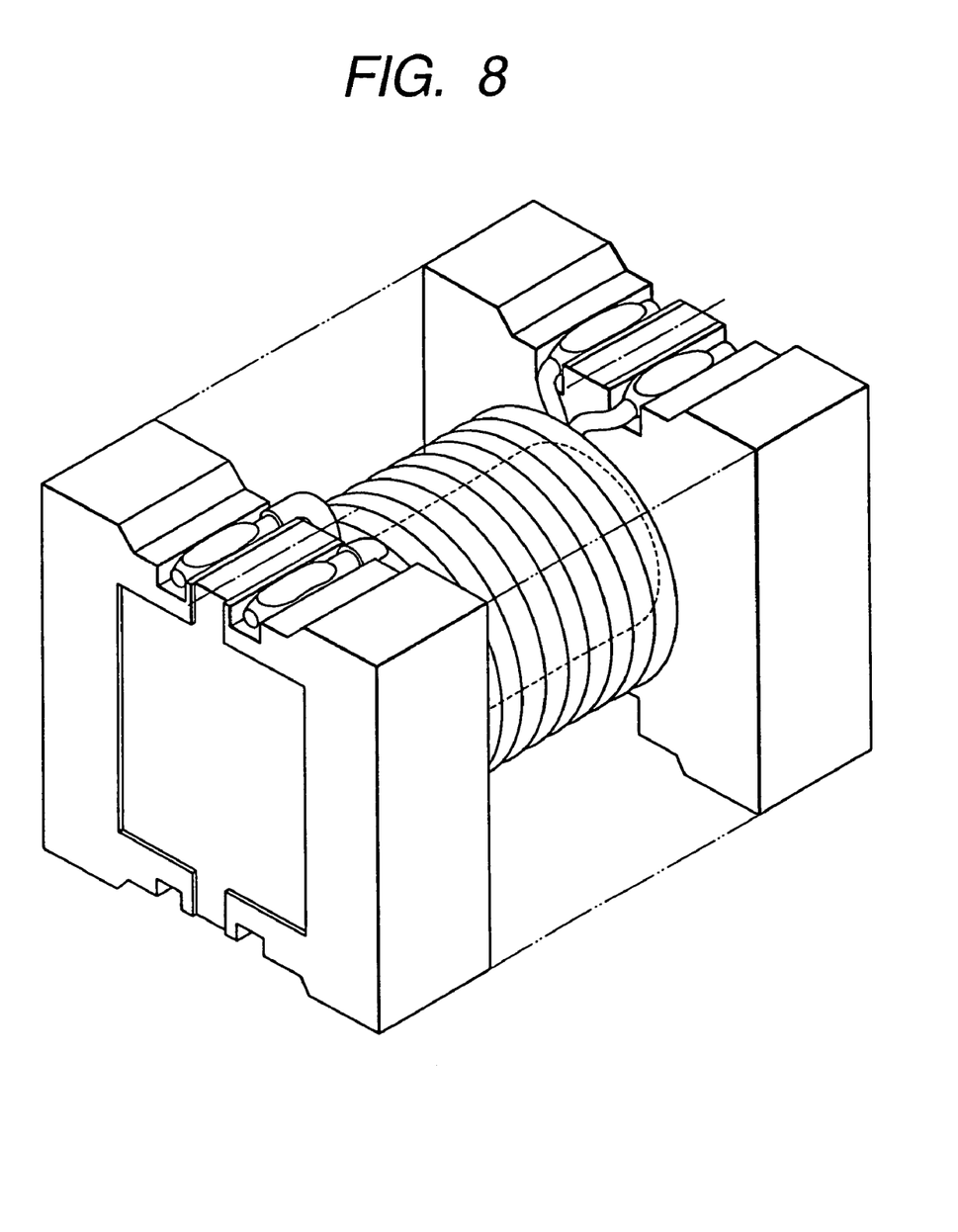
FIG. 8 is a perspective view showing an example of the common-mode filter according to the background art.

There is also known a structure, as shown in FIG. 8, in which normal-mode impedance is reduced in such a manner that a pair of wires are bifilar-wound on a core portion of a drum type core to improve the degree of coupling of the wires, and that lead-out portions of the pair of wires are led out while coming close to each other to improve the degree of coupling of the wire lead-out portions (Japanese Patent Unexamined Publication No. 2003-77730).

When the pair of wires are bifilar-wound while substantially coming into close contact with each other as described in Patent Document 3, normal-mode impedance can be reduced but this is true only in a frequency band sufficiently lower than the cutoff frequency. If the wires come into close contact with each other, there arises a problem that the cutoff frequency is lowered because inter-wire capacitance increases. Particularly in use for a high-speed differential signal interface such as a DVI or an HDMI, a cutoff frequency of about 6 GHz or higher is required. Such a high cutoff frequency cannot be achieved if the pair of wires are just bifilar-wound. Incidentally, in Japanese Patent Unexamined Publication No. 2003-77730, there has been also described a structure in which ends of the wires are connected to the electrodes through electrically conductive junction grooves while separated. Because the wires are led out while coming into close contact with each other in the wire lead-out potions, the problem of reduction in interline voltage proofness and insulation resistance, however, still arises when the electrically insulating films of the wires are deteriorated by heat at the time of connection of the wires. In addition, it is failed to teach about the material of a magnetic core exhibiting good magnetic characteristic in a frequency band of GHz.

SUMMARY OF THE INVENTION

Under such circumstances, a first object of the invention is to provide a surface mounting type common-mode filter which is so high in cutoff frequency as to be adapted for transmission of high-speed differential signals and which has high withstand voltage and high reliability.

A second object of the invention is to provide a surface mounting type common-mode filter in which variation in inter-wire distance between wires wound on a drum type core is minimized to attain reduction of variation in electrical characteristic.

(1) To achieve the foregoing objects, the invention provides a common-mode filter comprising: a magnetic or non-magnetic drum type core including a core portion, and a pair of flange portions disposed on opposite sides of the core portion so as to be integrated with the core portion; electrodes provided on the pair of flange portions of the drum type core; and at least two wires wound on the core portion of the drum type core and having ends connected to the electrodes respectively, wherein: each of the flange portions of the drum type core has a groove between corresponding two of the electrodes, and a separation protrusion for separating the groove into two; the wires are wound on the core portion of the drum type core in such a distributed winding manner that an inter-wire distance (a) between the wires and a winding pitch (b) between adjacent turns of each of the wires are provided; and the wires are one-by-one led out through the grooves while separated by the separation protrusions so that the ends of the wires are connected to the electrodes respectively.

(2) The invention also provides a common-mode filter comprising: a magnetic or non-magnetic drum type core including a core portion, and a pair of flange portions disposed on opposite sides of the core portion so as to be integrated with the core portion; electrodes provided on the pair of flange portions of the drum type core; and at least two wires wound on the core portion of the drum type core and having ends connected to the electrodes respectively, wherein the core portion of the drum type core has a plurality of positioning convex or concave portions formed for positioning the wires while keeping the pitch between the wires constant.

(3) The invention further provides a common-mode filter according to the paragraph (1) or (2) and further comprising a magnetic or non-magnetic plate-shaped core fixed between top surfaces of the pair of flange portions of the drum type core.

(4) The invention further provides a common-mode filter according to the paragraph (1) or (2) and further comprising a composite magnetic material provided for bridging over a space between top surfaces of the pair of flange portions of the drum type core.

(5) The invention further provides a common-mode filter according to any one of the paragraphs (1) through (4), wherein the drum type core is made of ferrite containing 40 mol % to 49.8 mol % of $Fe_2O_3$, 10 mol % to 33 mol % of ZnO, 2 mol % to 10 mol % of CuO, 1 mol % or less of $Mn_2O_3$, and the residual part of NiO and further containing 0.03 wt % to 0.5 wt % of $SiO_2$.

DETAILED DESCRIPTION OF THE PREFERRED EMBODIMENTS

Embodiments of the invention as to a common-mode filter will be described below with reference to the drawings.

Figure 1:
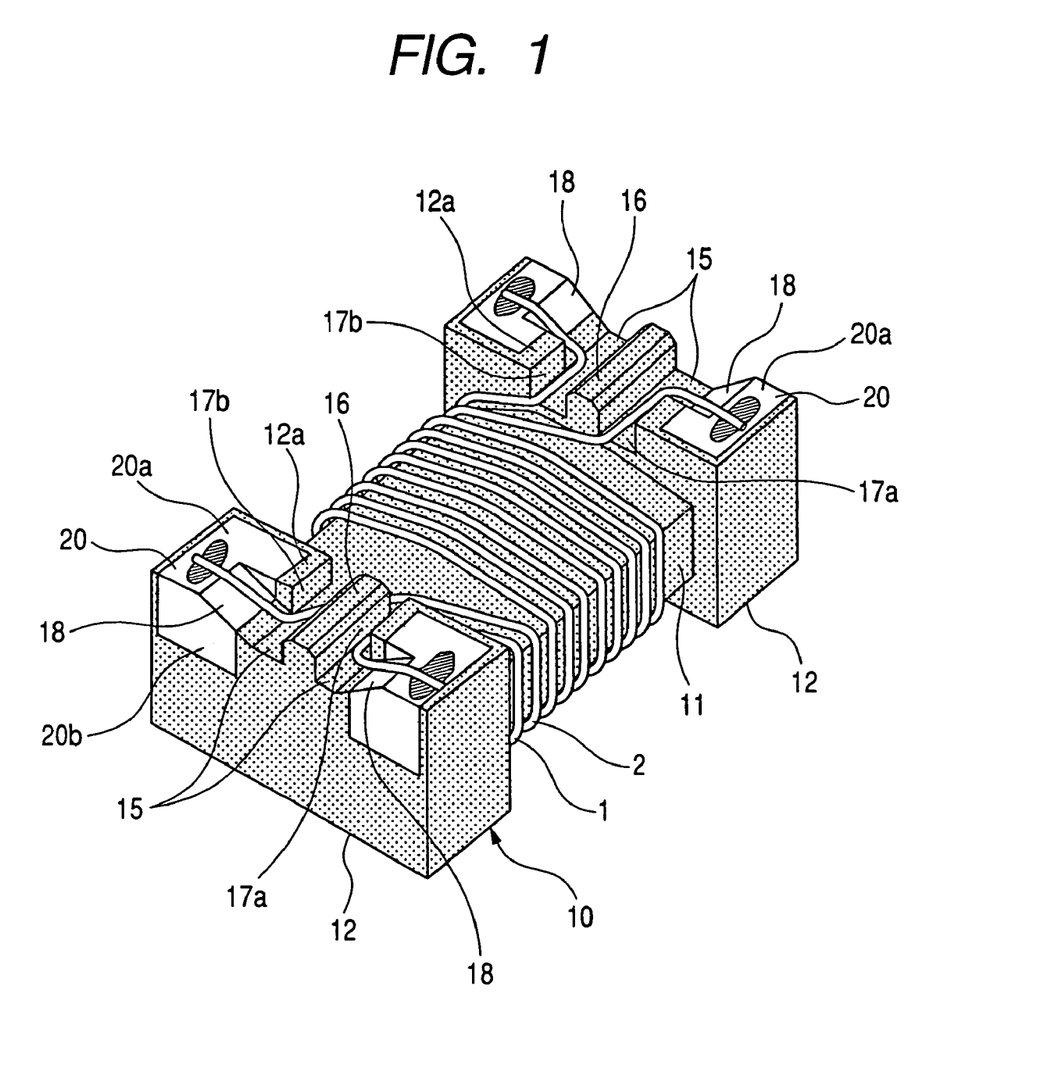
FIG. 1 is a perspective view of a common-mode filter according to a first embodiment of the invention in the case where the bottom side (surface mount side) of the common-mode filter faces upward.
Figure 2:
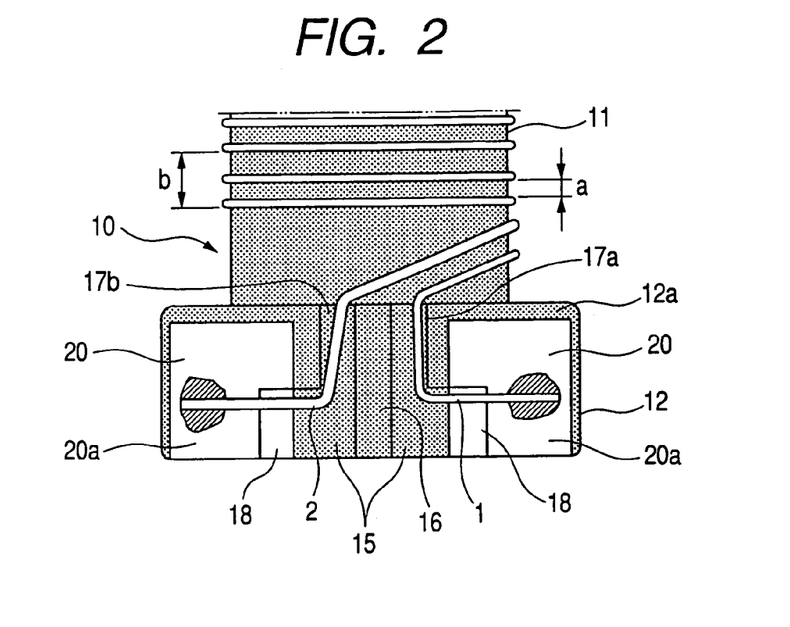
FIG. 2 is a bottom view enlargedly showing a wire end joint portion of the common-mode filter according to the first embodiment.

FIGS. 1 and 2 show a common-mode filter according to a first embodiment of the invention. FIG. 1 is a perspective view of the common-mode filter in the case where the bottom side (mount surface side) of the common-mode filter faces upward. FIG. 2 is a bottom view enlargedly showing a wire end joint portion of the common-mode filter. In FIGS. 1 and 2, the reference numeral 10 designates a magnetic drum type core made of a magnetic substance. The magnetic drum type core 10 includes a core portion 11, and a pair of quadrangular flange portions 12 disposed on opposite sides of the core portion 11. Each of the quadrangular flange portions 12 in the drum type core 10 has two electrodes 20 formed by metal paste baking, metal plating or the like. Each of the electrodes 20 has a lower electrode portion (user electrode portion) 20a located in a lower surface (mount surface) of each of opposite end portions of the quadrangular flange portion 12, and a side electrode portion 20b located in a side surface (outer end surface). In each of the electrodes 20, the lower electrode portion 20a and the side electrode portion 20b are formed so as to be continued to each other.

Ferrite in the following composition range can be used as the magnetic substance of the drum type core 10.

Ferric oxide ($Fe_2O_3$): 40 to 49.8 mol %
Zinc oxide (ZnO): 10 to 33 mol %
Cupric oxide (CuO): 2 to 10 mol %
Manganese oxide ($Mn_2O_3$): not larger than 1 mol %
Nickel oxide (NiO): residual part
Silicon dioxide ($SiO_2$): 0.03 to 0.5 wt %

This ferrite exhibits high magnetic permeability in a frequency band of GHz. If the composition of ferrite is within the aforementioned range, the magnetic permeability in the frequency band of GHz will not deteriorate.

An example of the composition of ferrite used as the drum type core in this embodiment is as follows.

Ferric oxide ($Fe_2O_3$): 45.60 mol %
Zinc oxide (ZnO): 29.70 mol %
Cupric oxide (CuO): 7.33 mol %
Manganese oxide ($Mn_2O_3$): 0.50 mol %
Nickel oxide (NiO): 16.87 mol %
Silicon dioxide ($SiO_2$): very small quantity (predetermined value in a range of from 0.03 to 0.5 wt %)

According to the composition described in this example, good magnetic characteristic can be obtained in a frequency range up to about 6 GHz.

In a lower surface 12a of each quadrangular flange portion 12 which is formed so that the lower electrode portions 20a of the electrodes 20 are located on opposite sides of the lower surface 12a, a wide groove 15 is provided to cross the central portion of the lower surface 12a in the axial direction of the core portion 11. A separation protrusion 16 is formed in the widthwise middle position of the wide groove 15. As a result, the wide groove 15 is separated into two lead-out groove portions 17a and 17b by the separation protrusion 16.

A pair of wires 1 and 2 are wound on the core portion 11 of the drum type core 10. The pair of wound wires 1 and 2 are led out through the two lead-out groove portions 17a and 17b (into which each wide groove 15 is separated by a corresponding separation protrusion 16) respectively. Ends of the wires are connected to the lower electrode portions 20a of the electrodes 20 respectively (ends of the wires are electrically connected to the lower electrode portions 20a of the electrodes 20 at joint positions P in FIG. 2) by thermal contact bonding, soldering or the like (while the wires are separated from each other by the separation protrusions 16). Incidentally, slope concave surfaces 18 extending from bottom surfaces of the lead-out groove portions 17a and 17b to flat surfaces of the lower electrode portions 20a are formed along end surfaces of the quadrangular flange portions respectively to make it easy to lead out the ends of the wires 1 and 2 to the lower electrode portions 20a.

The pair of wires 1 and 2 are not densely wound in order to increase the cutoff frequency of the common-mode filter (preferably, to set the cutoff frequency at 6 GHz or higher). That is, as shown in FIG. 2, the pair of wires 1 and 2 are distributedly (space) wound in the condition of a predetermined inter-wire distance (a) between the wires 1 and 2 and a predetermined winding pitch (b) between adjacent turns in each of the wires 1 and 2 in order to reduce inter-wire capacitance. In addition, the lead-out portions of the wires 1 and 2 are also set to be led out through the lead-out groove portions 17a and 17b and connected to the lower electrode portions 20a while the distance between the lead-out portions of the wires 1 and 2 is kept not smaller than the inter-wire distance (a) in order to reduce inter-wire capacitance. For this reason, it can be said that the width of each of the separation protrusions 16 is preferably selected to be not smaller than the inter-wire distance (a). In this case, thermally weldable wires such as cement wires may be preferably used as the wires in order to prevent positional displacement of the wires.

Because the drum type core 10 is made of ferrite exhibiting high magnetic permeability in a frequency band of GHz as described above, the effect of suppressing common-mode noise in the frequency band of GHz can be improved.

For example, the product shape of the common-mode filter produced according to the first embodiment is not larger than the 4532 type (4.5 mm long, 3.2 mm wide and 3.2 mm high). In this case, the diameter of each of the wires 1 and 2 used is not larger than 0.06 mm.

In the common-mode filter according to the first embodiment of the invention, the risk of short-circuiting between different lines can be reduced to improve reliability because the separation protrusions 16 are formed in the middle positions of the wide grooves 15 of the quadrangular flange portions 12 so that the wires 1 and 2 are separated from each other in places near the wire end-connecting portions as shown in FIG. 2 to eliminate the places where different-line wires come into contact with each other.

Figure 3:
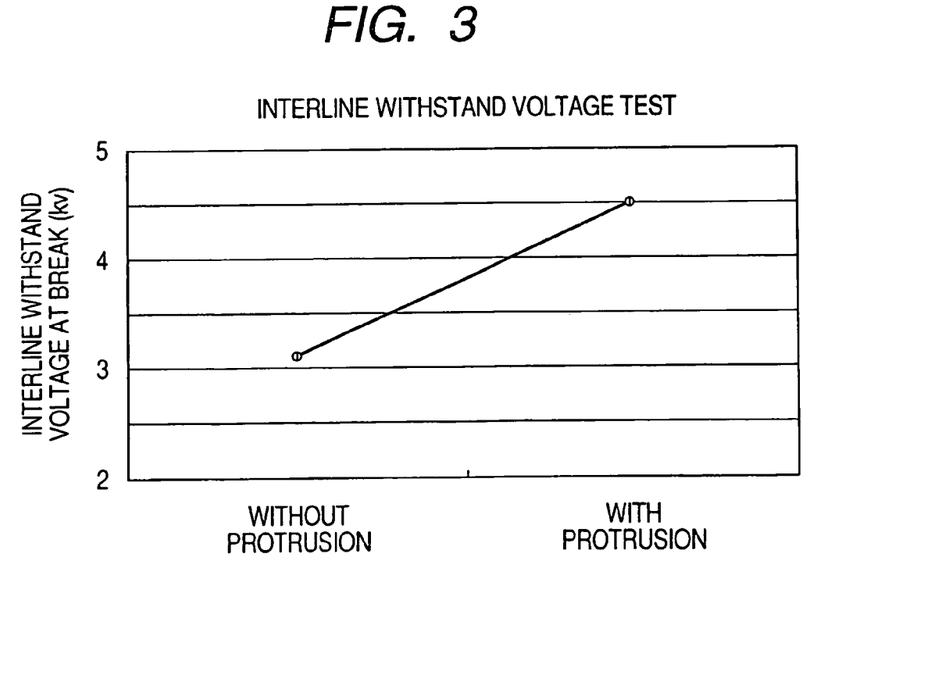
FIG. 3 is a graph showing comparison between the interline withstand voltage in the first embodiment according to the invention in which a separation protrusion is provided in a groove between electrodes on each flange portion and the interline withstand voltage in the background art in which the separation protrusion is not provided.

FIG. 3 shows a measured result of break-down voltage between lines in the common-mode filter according to this embodiment (a product with protrusions) in comparison with a measured result of break-down voltage between lines in the background-art common-mode filter (a product without protrusions). As is obvious from the measured results, it is confirmed that the interline with stand voltage in the common-mode filter according to this embodiment increases by 50% compared with that in the background-art common-mode filter.

According to the first embodiment, the following effects can be obtained.

(1) The cutoff frequency of the common-mode filter can be increased (for example, to about 6 GHz) when the wires 1 and 2 are distributedly wound in the condition of a predetermined inter-wire distance (a) between the wires 1 and 2 and a predetermined winding pitch (b) between adjacent turns in each of the wires 1 and 2 as shown in FIG. 2.

(2) The effect of suppressing common-mode noise in a frequency band of GHz can be improved when the drum type core 10 is made of ferrite having high magnetic permeability in the frequency band of GHz and containing components in the following composition range.

Ferric oxide ($Fe_2O_3$): 40 to 49.8 mol %
Zinc oxide (ZnO): 10 to 33 mol %
Cupric oxide (CuO): 2 to 10 mol %
Manganese oxide ($Mn_2O_3$): not larger than 1 mol %
Nickel oxide (NiO): residual part
Silicon dioxide ($SiO_2$): 0.03 to 0.5 wt %

Particularly, a more excellent common-mode noise suppressing effect can be obtained when the composition of ferrite as an example is as follows.

Ferric oxide ($Fe_2O_3$): 45.60 mol %
Zinc oxide (ZnO): 29.70 mol %
Cupric oxide (CuO): 7.33 mol %
Manganese oxide ($Mn_2O_3$): 0.50 mol %
Nickel oxide (NiO): 16.87 mol %
Silicon dioxide ($SiO_2$): very small quantity (predetermined value in a range of from 0.03 to 0.5 wt %)

(3) The risk of short-circuiting between different lines can be reduced to attain improvement of reliability and greater improvement of interline voltage proofness because the separation protrusions 16 are formed in the middle positions of the wide grooves 15 of the quadrangular flange portions 12 so that the wires 1 and 2 are separated from each other in places near the portions where ends of the wires 1 and 2 are connected to the electrodes. On this occasion, the lead-out portions of the wires 1 and 2 are also led out through the lead-out groove portions 17a and 17b while the distance between the wires 1 and 2 is kept not smaller than the inter-wire distance (a) in order to reduce inter-wire capacitance between the lead-out portions of the wires 1 and 2.

Figure 4:
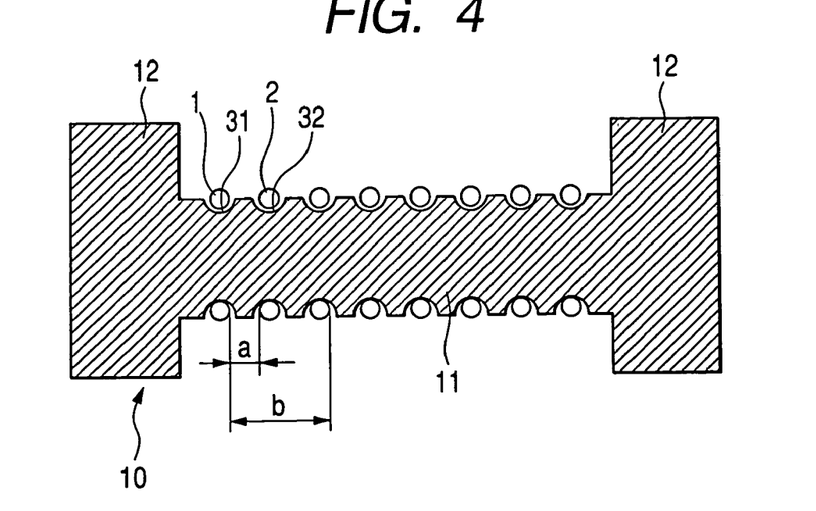
FIG. 4 is a frontal sectional view showing a vertical section taken along central positions of quadrangular flange portions of a drum type core in a second embodiment of the invention.

FIG. 4 shows a vertical section taken along the central positions of the quadrangular flange portions 12 of the drum type core 10 in the common-mode filter according to a second embodiment of the invention. In this embodiment, concave grooves 31 and 32 are formed in the core portion 11 of the drum type core 10 so that the concave grooves 31 and 32 are used as concave portions for positioning the pair of wires 1 and 2 respectively. The wire 1 is wound on the core portion 11 while positioned by the concave groove 31. The wire 2 is wound on the core portion 11 while positioned by the concave groove 32. In this case, the inter-wire distance (a) between the wires 1 and 2 and the winding pitch (b) between adjacent turns in each of the wires 1 and 2 are decided by the positions of the concave grooves 31 and 32 in advance.

In accordance with the second embodiment, variation in inter-wire distance (a) between the wires 1 and 2 and variation in winding pitch (b) between adjacent turns in each of the wires 1 and 2 can be minimized to attain reduction in variation in electrical characteristic of products because the positions of the wires 1 and 2 are decided accurately by the concave grooves 31 and 32 even in the case where the pair of wires 1 and 2 are distributedly wound.

Incidentally, other configuration, operation and effect of the second embodiment are the same as those of the first embodiment.

Figure 5:
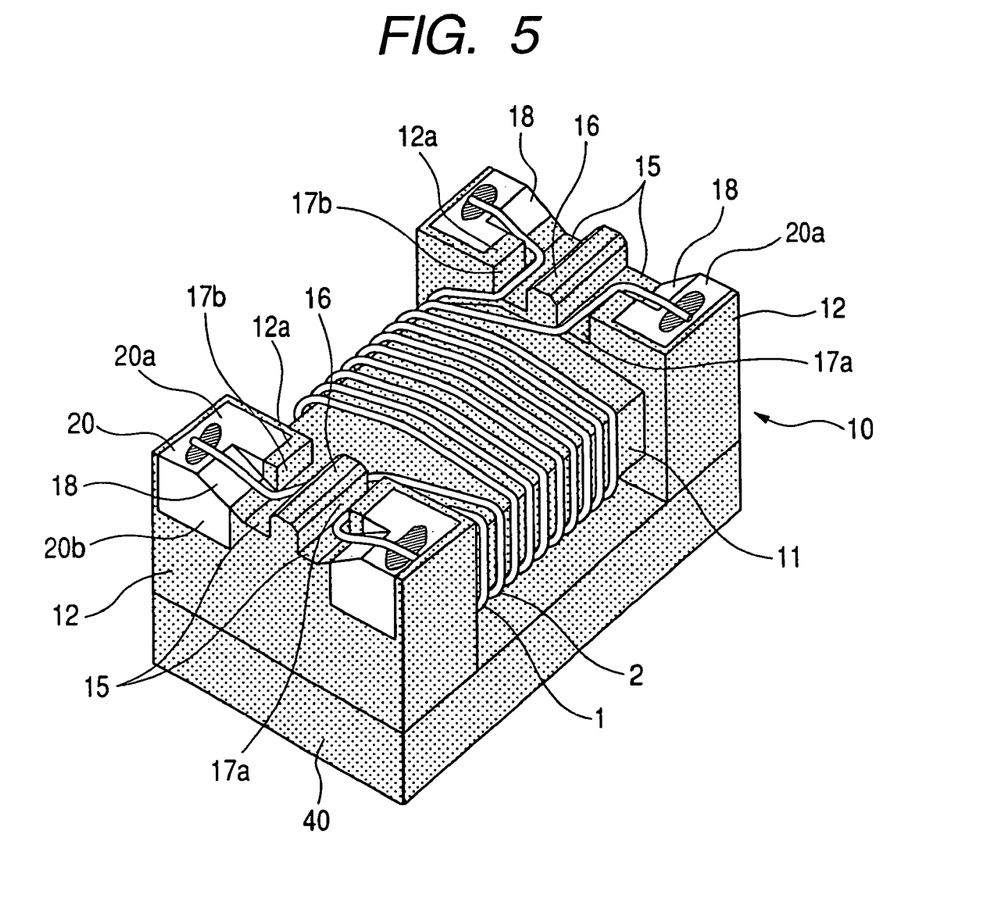
FIG. 5 is a perspective view of the common-mode filter according to a third embodiment of the invention in the case where the bottom side of the common-mode filter faces upward.

FIG. 5 shows a third embodiment of the invention. In this embodiment, after the wires 1 and 2 are wound on the core portion 11 of the drum type core 10, a flat plate 40 made of a magnetic or non-magnetic substance is fixed between upper surfaces of the two quadrangular flange portions 12 of the drum type core 10 by an adhesive resin or the like so as to be integrated with the upper surfaces of the two quadrangular flange portions 12. The plate 40 is used for providing the top surface of the resulting product as a flat surface so that the resulting product can be adsorbed onto an adsorption nozzle of an automatic mounting apparatus. In addition, when the plate 40 as well as the drum type core 10 is made of a magnetic substance, the drum type core 10 and the plate-shaped core 40 can be magnetically coupled to each other to synthesize a closed magnetic circuit core to improve interline coupling and reduce leakage magnetic flux to thereby contribute to improvement in common-mode noise suppressing characteristic. The plate-shaped core 40 can be made of the same magnetic substance as that of the drum type core 10. Incidentally, because other configuration, operation and effect of the third embodiment are the same as those of the first embodiment, parts the same as or equivalent to those in the first embodiment are denoted by the same reference numerals as those in the first embodiment for the sake of avoidance of duplicated description.

Figure 6:
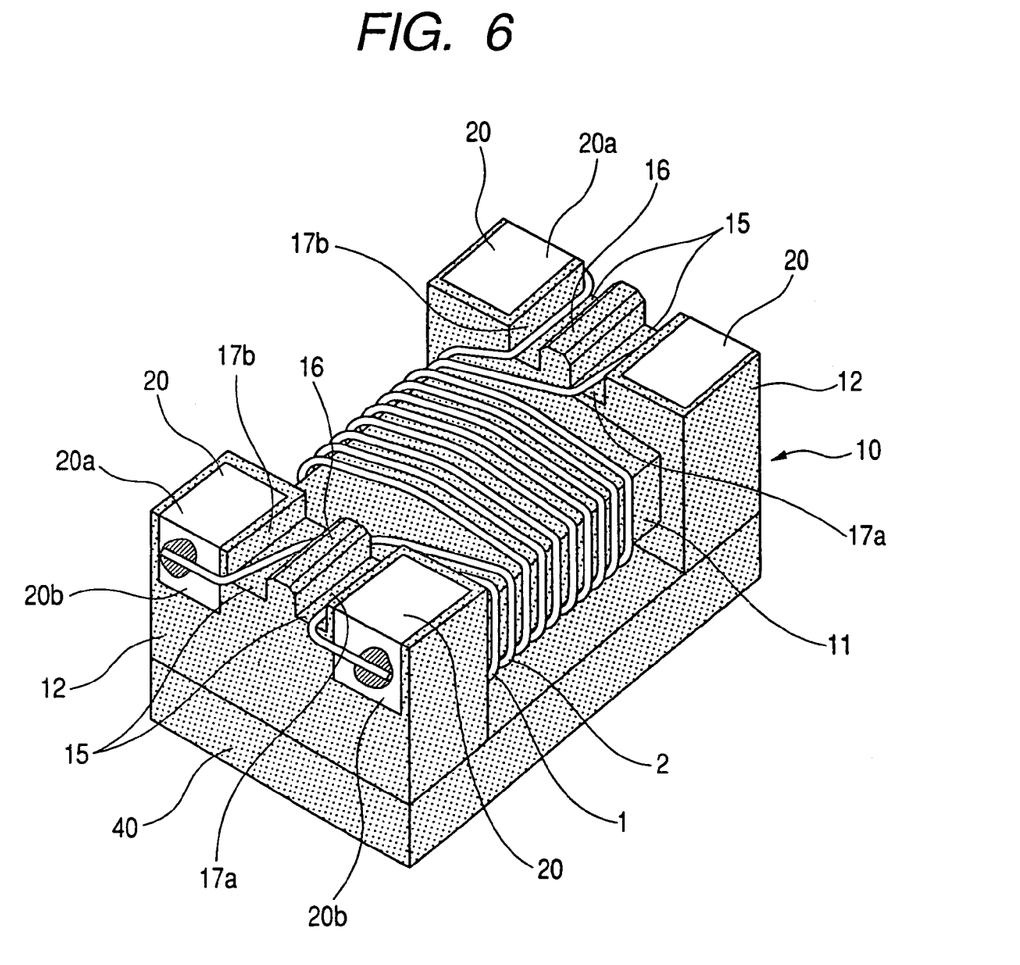
FIG. 6 is a perspective view of the common-mode filter according to a fourth embodiment of the invention in the case where the bottom side of the common-mode filter faces upward.

FIG. 6 shows a fourth embodiment of the invention. In this embodiment, the pair of wires 1 and 2 are wound on the core portion 11 of the drum type core 10, further led out through the two lead-out groove portions 17a and 17b (into which each groove 15 is separated by corresponding one of the separation protrusions 16) and connected to the side electrode portions 20b of the electrodes 20 by thermal contact bonding, soldering or the like (while separated by the separation protrusions 16).

According to the fourth embodiment, the thickness of each of the lower electrode portions 20a on the actually mounting side is not increased because ends of the wires are connected to the side electrode portions 20b. Accordingly, variation in height can be reduced to attain a low height. Incidentally, because other configuration, operation and effect of the fourth embodiment are the same as those of the third embodiment, parts the same as or equivalent to those in the third embodiment are denoted by the same reference numerals as those in the third embodiment for the sake of avoidance of duplicated description.

Figure 7:
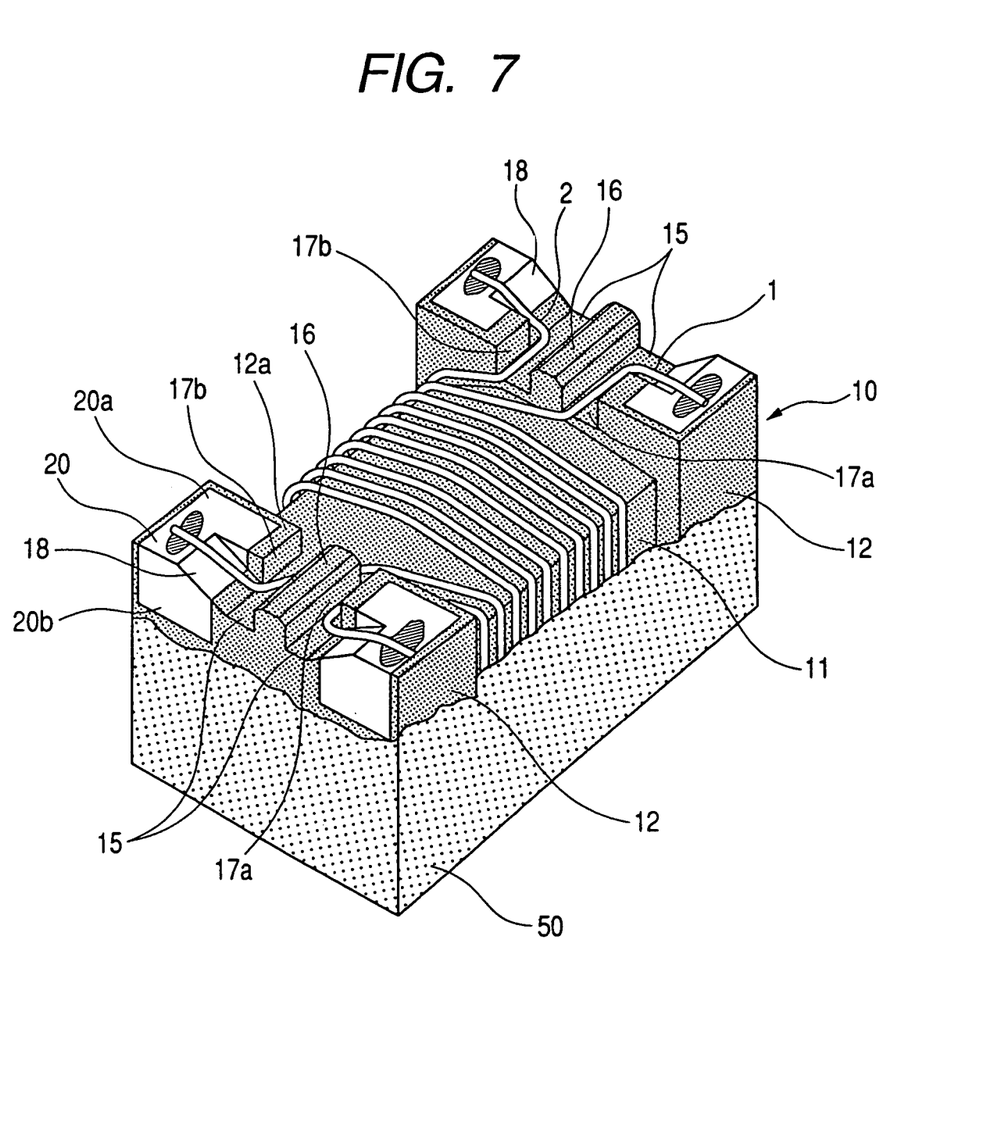
FIG. 7 is a perspective view of the common-mode filter according to a fifth embodiment of the invention in the case where the bottom side of the common-mode filter faces upward.

FIG. 7 shows a fifth embodiment of the invention. In this embodiment, a composite magnetic material 50 as a mixture of magnetic powder such as ferrite powder and a resin such as an epoxy resin is used in place of the plate-shaped core fixed to the magnetic drum type core 10 of ferrite or the like. The composite magnetic material 50 is provided by integral molding so as to bridge over a space between the upper surfaces of the two quadrangular flange portions 12 of the drum type core 10. That is, the top surface of the common-mode filter is covered with the composite magnetic material 50 flatly.

According to the fifth embodiment, the magnetic drum type core 10 and the composite magnetic material 50 can be magnetically coupled to each other to synthesize a closed magnetic circuit core to improve interline coupling and reduce leakage magnetic flux to thereby contribute to improvement in common-mode noise suppressing characteristic. In addition, the upper surface of the composite magnetic material 50 can be provided as a flat surface, so that the resulting product can be shaped so as to be able to be adsorbed onto an adsorption nozzle of an automatic mounting apparatus. Incidentally, because other configuration, operation and effect of the fifth embodiment are the same as those of the third embodiment, parts the same as or equivalent to those in the first embodiment are denoted by the same reference numerals as those in the first embodiment for the sake of avoidance of duplicated description.

Although the second embodiment of the invention has been described on the case where concave grooves are formed in the core portion of the drum type core so that the concave grooves are used as concave portions for positioning the wires respectively, the invention may be applied to a structure in which wire positioning convex portions are formed in the core portion.

Although the respective embodiments have been described on the case where a magnetic drum type core made of a magnetic substance is used, a drum type core made of a non-magnetic dielectric substance (such as a ceramic substance) may be used in accordance with the purpose of use.

Although the embodiments of the invention have been described above, the invention is not limited thereto and it will be self-evident to those skilled in the art that various modifications and changes may be made without departing from the scope of Claims.

As described above, in accordance with the invention, there is provided a common-mode filter comprising: a magnetic or non-magnetic drum type core including a core portion, and a pair of flange portions disposed on opposite sides of the core portion so as to be integrated with the core portion; electrodes provided on the pair of flange portions of the drum type core; and at least two wires wound on the core portion of the drum type core and having ends connected to the electrodes respectively, wherein: each of the flange portions of the drum type core has a groove between corresponding two of the electrodes, and a separation protrusion for separating the groove into two; the wires are wound on the core portion of the drum type core in such a distributed winding manner that an inter-wire distance (a) between the wires and a winding pitch (b) between adjacent turns of each of the wires are provided; and the wires are one-by-one led out through the grooves while separated by the separation protrusions so that the ends of the wires are connected to the electrodes respectively. In this configuration, there can be achieved a surface mounting type common-mode filter which is so high in cutoff frequency as to be adapted for transmission of high-speed differential signals in a DVI, an HDMI or the like and which has high voltage proofness and high reliability.

According to the invention, there is also provided a common-mode filter comprising: a magnetic or non-magnetic drum type core including a core portion, and a pair of flange portions disposed on opposite sides of the core portion so as to be integrated with the core portion; electrodes provided on the pair of flange portions of the drum type core; and at least two wires wound on the core portion of the drum type core and having ends connected to the electrodes respectively, wherein the core portion of the drum type core has a plurality of positioning convex or concave portions formed for positioning the wires while keeping the pitch between the wires constant. In this configuration, there can be achieved a surface mounting type common-mode filter in which variation in inter-wire distance between wires wound on a drum type core is minimized to attain reduction of variation in electrical characteristic.

What is claimed is:

1. A common-mode filter comprising:
   a magnetic or non-magnetic drum type core including a core portion, and a pair of flange portions disposed on opposite sides of said core portion so as to be integrated with said core portion;
   electrodes provided on said pair of flange portions of said drum type core; and
   at least two wires wound on said core portion of said drum type core and having ends connected to said electrodes respectively,
   wherein each of said flange portions of said drum type core has a groove between corresponding two of said electrodes, and a separation protrusion for separating said groove into two;
   said wires are wound on said core portion of said drum type core in such a distributed winding manner that an inter-wire distance between said wires is provided so that no part of any wound wire, including any insulating portion of a wound wire, contacts any other part of any other wound wire, and a winding pitch between adjacent turns of each of said wires is also provided; and
   said wires are one-by-one led out through said grooves while separated by said separation protrusions so that said ends of said wires are connected to respective ones of said electrodes, wherein
   the separation protrusion has a width greater than the inter-wire distance.

2. A common-mode filter according to claim 1, further comprising a magnetic or non-magnetic plate-shaped core fixed between top surfaces of said pair of flange portions of said drum type core.

3. A common-mode filter according to claim 1, further comprising a composite magnetic material provided for bridging over a space between top surfaces of said pair of flange portions of said drum type core.

4. A common-mode filter according to any one of claims 1 through 3, wherein said drum type core is made of ferrite containing 40 mol % to 49.8 mol % of $Fe_2O_3$, 10 mol % to 33 mol % of ZnO, 2 mol % to 10 mol % of CuO, 1 mol % or less of $Mn_2O_3$, and the residual part of NiO and further containing 0.03 wt % to 0.5 wt % of $SiO_2$.

5. A common-mode filter comprising:
   a magnetic or non-magnetic drum type core including a core portion, and a pair of flange portions disposed on opposite sides of said core portion so as to be integrated with said core portion;
   electrodes provided on said pair of flange portions of said drum type core; and
   at least two wires wound on said core portion of said drum type core and having ends connected to said electrodes respectively,
   wherein said core portion of said drum type core has a plurality of positioning convex or concave portions formed for positioning said at least two wires so that no part of any wound wire, including any insulating portion of a wound wire, contacts any other part of any other wound wire, while keeping the pitch between said at least two wires constant.

6. A common-mode filter according to claim 5, further comprising a magnetic or non-magnetic plate-shaped core fixed between top surfaces of said pair of flange portions of said drum type core.

7. A common-mode filter according to claim 5, further comprising a composite magnetic material provided for bridging over a space between top surfaces of said pair of flange portions of said drum type core.

8. A common-mode filter according to any one of claims 5 through 7, wherein said drum type core is made of ferrite containing 40 mol % to 49.8 mol % of $Fe_2O_3$, 10 mol % to 33 mol % of ZnO, 2 mol % to 10 mol % of CuO, 1 mol % or less of $Mn_2O_3$, and the residual part of NiO and further containing 0.03 wt % to 0.5 wt % of $SiO_2$.

* * * * *